United States Patent [19]

Bula et al.

[11] 4,130,768
[45] Dec. 19, 1978

[54] LOW POWER TRUE/COMPLEMENT DRIVER

[75] Inventors: John Bula, Rockville, Md.; Ashok C. Patrawala, Manassas, Va.

[73] Assignee: International Business Machines Corporation, Armonk, N.Y.

[21] Appl. No.: 829,416

[22] Filed: Aug. 31, 1977

[51] Int. Cl.² .................. H03K 17/60; G11C 8/00; H03K 19/40; H03K 17/16

[52] U.S. Cl. .................. 307/270; 307/200 B; 307/244; 307/251; 307/279; 307/DIG. 1; 307/DIG. 4; 365/230

[58] Field of Search ............ 307/205, 241, 244, 251, 307/270, 279, DIG. 1, DIG. 4, DIG. 5; 365/230, 231, 233

[56] References Cited

U.S. PATENT DOCUMENTS

| | | | |
|---|---|---|---|
| 3,575,613 | 4/1971 | Ebertin | 307/DIG. 4 X |
| 3,906,463 | 9/1975 | Yu | 307/DIG. 5 X |
| 3,940,747 | 2/1976 | Kuo et al. | 307/DIG. 5 X |
| 3,946,369 | 3/1976 | Pashley | 307/DIG. 3 X |
| 4,031,415 | 6/1977 | Redwine et al. | 307/DIG. 5 X |
| 4,038,646 | 7/1977 | Mehta et ala. | 307/DIG. 5 X |

OTHER PUBLICATIONS

Gladstein et al., "Low-Power Ratioless True-Complement Buffer", *IBM Tech. Discl. Bull.*; vol. 18, No. 8, pp. 2591–2592; 1/1976.

Anderson, "Address Encoding Circuit", *IBM Tech. Discl. Bull.*; vol. 17, No. 3, pp. 796–797; 8/1974.

Furman, "Address Buffer True/Complement Generator", *IBM Tech. Discl. Bull.*; vol. 18, No. 11, pp. 3597–3598; 4/1976.

Kuo et al., "16-K Ram Built with Proven Process may Offer High Start-Up Reliability"; *Electronics* (pub.); pp. 81–86; 5/13/1976.

*Primary Examiner*—Larry N. Anagnos
*Attorney, Agent, or Firm*—John E. Hoel

[57] ABSTRACT

The prior art, low power ratioless true/complement driver is improved upon by connecting a first isolation FET (T2) so that its gate is connected to drain potential ($V_{DD}$) and by connecting to the second isolation FET (T4) so that its gate is connected to the phase-splitting node (1). This enables the number of clock pulse sources necessary to operate the generator circuit to be reduced by one so that the speed of the generator circuit is increased, by virtue of the second isolation FET (T4) having a gate size substantially smaller than the gate size of the inverting FET (T3) so that it will more rapidly switch from its on-state to its off-state than does the inverting FET.

3 Claims, 4 Drawing Figures

LOW POWER TRUE/COMPLEMENT DRIVER

FIELD OF THE INVENTION

The invention disclosed relates to FET circuitry and more particularly is directed to an improved true/complement generator circuit.

BACKGROUND OF THE INVENTION

Binary, true/complement signal generation circuits are generally used to drive decoder circuits such as are required to decode the address signals for an array of storage elements. In the state-of-the-art semiconductor memory arrays, the overall storage cycle time is limited by the speed of the signal buffering circuits for address decoders, which must drive the large capacitive loads represented by the large plurality NOR decoder gates.

OBJECTS OF THE INVENTION

It is an object of the invention to insure the switching speed of a true/complement generator circuit.

It is another object of the invention to reduce the number of clocking pulses required for operating a true/complement generator circuit.

SUMMARY OF THE INVENTION

These and other objects, features and advantages are accomplished by the ratioless low power true/complement generator circuit disclosed herein.

The prior art, low power ratioless true/complement buffer is improved upon by connecting a first isolation FET (T2) so that its gate is connected to drain potential ($V_{DD}$) and by connecting to the second isolation FET (T4) so that its gate is connected to the phase-splitting node (1). This enables the number of clock pulse sources necessary to operate the generator circuit to be reduced by one so that the speed of the generator circuit is increased, by virtue of the second isolation FET (T4) having a gate size substantially smaller than the gate size of the inverting FET (T3) so that it will more rapidly switch from its on-state to its off-state than does the inverting FET.

DESCRIPTION OF THE FIGURES

These and other objects, features and advantages will be more fully understood with reference to the accompanying Figures.

DISCUSSION OF THE PREFERRED EMBODIMENT

The prior art, low power ratioless true/complement buffer as represented by the publication by Gladstein, et al., "Low-Power Ratioless True-Complement Buffer", IBM Technical Disclosure Bulletin, Vol. 18, #8, January 1976, pp. 2591-92, is improved upon by connecting a first isolation FET (T2) so that its gate is connected to drain potential ($V_{DD}$) and by connecting to the second isolation FET (T4) so that its gate is connected to the phase-splitting node (1). This enables the number of clock pulse sources necessary to operate the generator circuit to be reduced by one so that the speed of the generator circuit is increased, by virtue of the second isolation FET (T4) having a gate size substantially smaller than the gate size of the inverting FET (T3) so that it will more rapidly switch from its on-state to its off-state than does the inverting FET.

Figure 1:
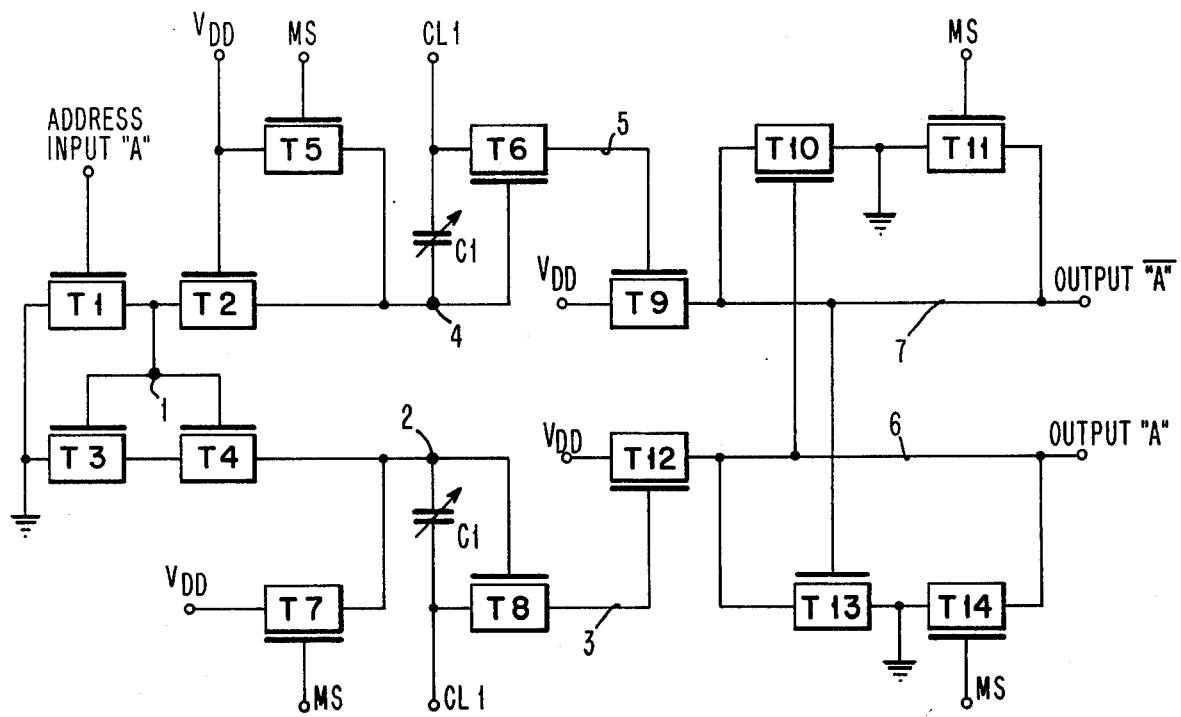
FIG. 1 is a circuit schematic of the improved true/-complement generator invention.
Figure 2:
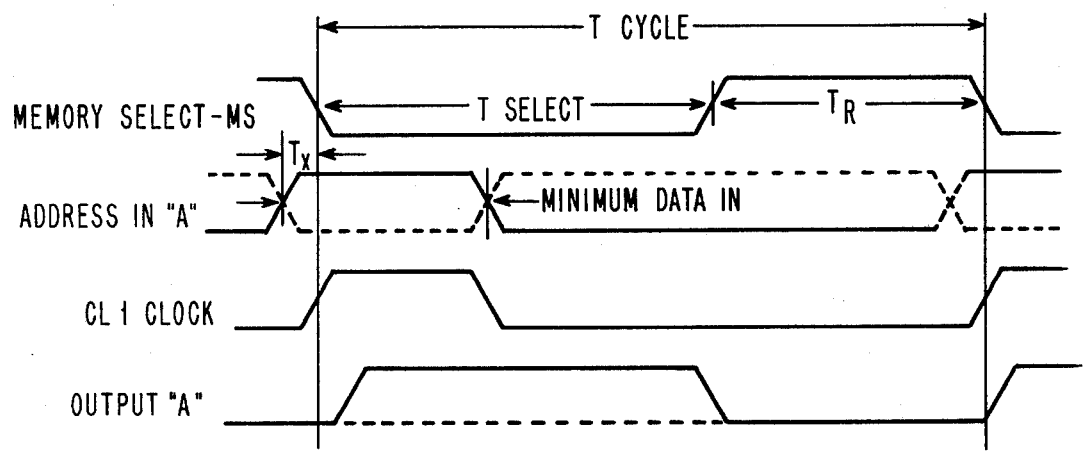
FIG. 2 is a waveform diagram for the circuit of FIG. 1.

The low power true/complement driver circuit shown in FIG. 1, generates a true and complement pulse. The timing diagram for its operation is shown in FIG. 2. In the unselected mode $T_R$ (memory select at up-level), node 6 and 7 will be at ground and nodes 2 and 4 are at the up level. In the selected mode (Tsel), memory select is set to ground and CL1 clock is set to a positive up-level. An address pulse applied to the gate of device T1 will set node 1 to ground and disable devices T3 and T4. Node 4 will discharge to ground and devices T6 and T9 will be off for the remainder of the cycle. However, node 2 will rise to a higher potential than $V_{DD}$ because of the variable bootstrap capacitor C1. Device T8 will conduct and node 3 will rise to the full CL1 clock voltage. Device T12 will conduct and set node 6 at $V_{DD}-V_t$. Thus, an address at the up-level (logical "1") applied to gate of device T1 generates a true at node 6 and complement and node 7. Converse of this is also true.

The longest delay path in data propagation from the input to the output is through nodes 1, 2, 3 and 6. Connecting the gate of device T4 to node 1 minimizes this delay data propagation. The true and complement outputs are capable of driving higher capacitive loads because of the circuits push-pull action. Also, the true and complement outputs are isolated from the input, clock CL1 and memory select. Address transfer is clocked by CL1 signal for a short time interval and noise immunity is provided to the input for the remainder of the cycle.

Figure 3:
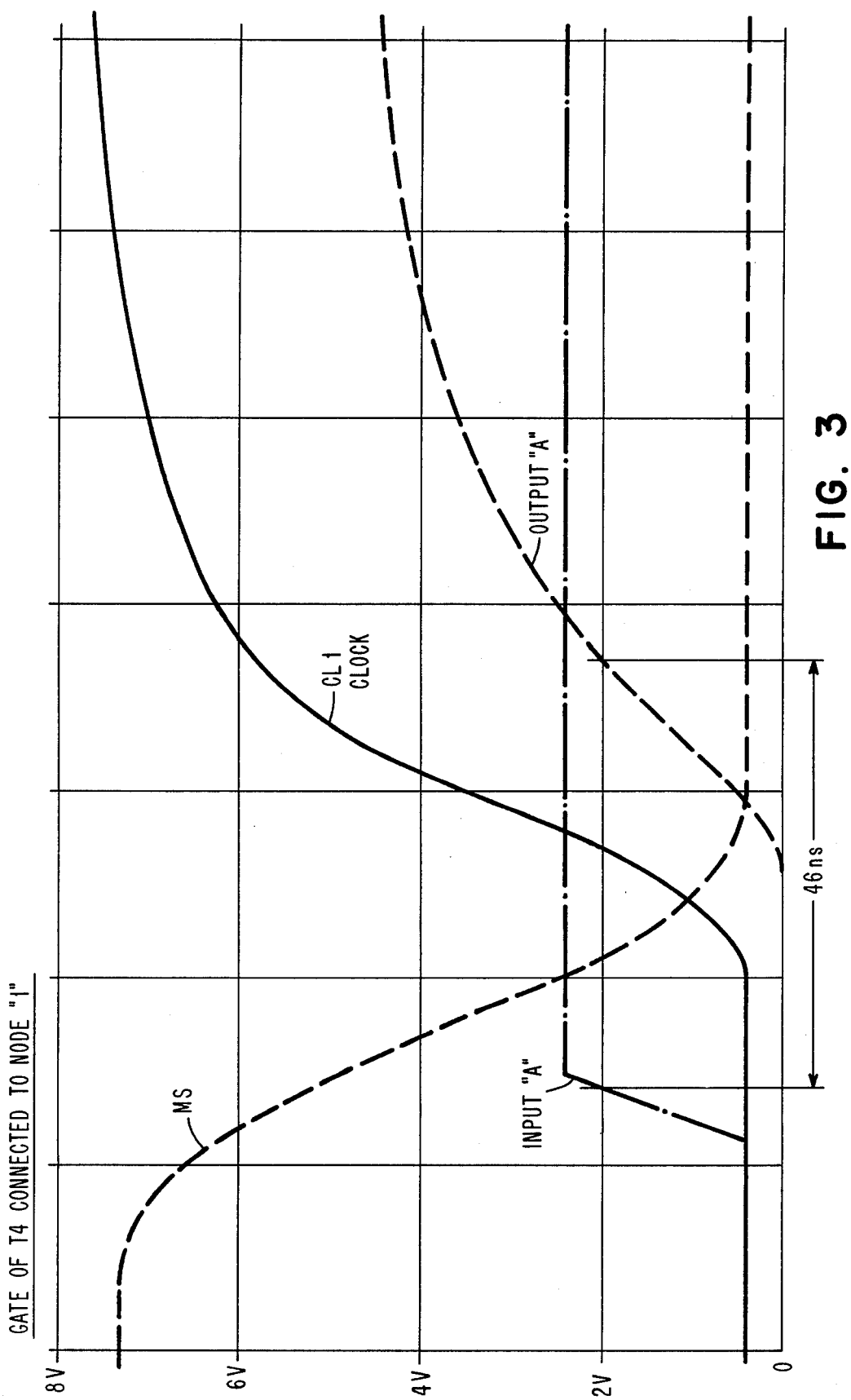
FIG. 3 is another waveform diagram for the circuit of FIG. 1.
Figure 4:
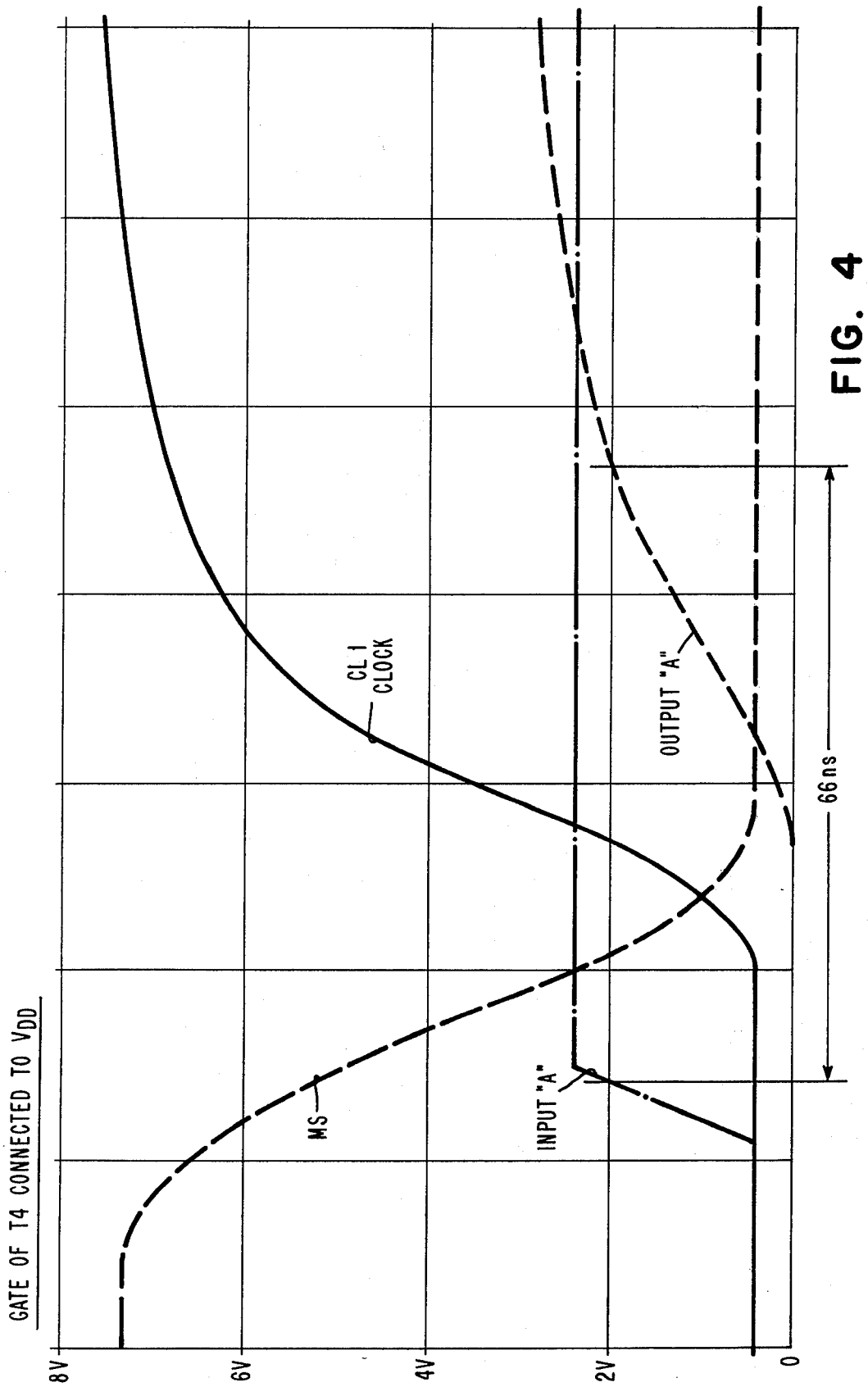
FIG. 4 is a waveform diagram for the prior art true/-complement circuit.

FIG. 3 illustrates that the true/complement generator invention achieves a 46 nanoseconds switching delay under the same conditions that the above cited prior art Gladstein, et al. circuit achieves in the longer switching delay of 66 nanoseconds, as shown in FIG. 4.

An additional advantage which accrues to the circuit shown in FIG. 1 is that the circuit is capable of driving high capacitive loads without capacitively loading the clock CL1 or the address input line A. This is accomplished by the isolation function performed by the transistors T9 and T12 whose drains are connected to the DC potential $V_{DD}$ and whose gates are respectively connected to the source of T6 and T8. By connecting the transistors T9 and T12 in this manner, the full driving potential of the $V_{DD}$ power supply minus the threshold voltages of T9 and T12, is applied to the outputs at nodes 6 and 7.

Transistors T10, T11, T13 and T14 are connected as a bistable latching circuit to latch-up the signals output on nodes 6 and 7. One of the principal advantages of the circuit shown in FIG. 1 is that the signal output at the source of transistors T9 and T12 become immediately available at the nodes 6 and 7 for use in subsequent circuits and yet a latching function is accomplished at nodes 6 and 7 by connecting the gate of transistor T10 to node 6 and the gate of transistor T13 to node 7 so that the relative polarity of the signals output on these nodes can be stored for as long as the null transistors T11 and T14 remain off. When the MS signal goes on, transistors T11 and T14 connect the nodes 7 and 6, respectively to ground potential thereby nulling the signal states on these nodes, effectively resetting the output latch for the next cycle.

While the invention has been particularly shown and described with reference to the preferred embodiment thereof, it will be understood by those skilled in the art that the foregoing and other changes in form and details may be made therein without departing from the spirit and scope of the invention.

We claim:

1. In a low power ratioless, true/complement generator circuit having an input FET with its gate connected to the input node, and its source connected to ground, and its drain connected to a phase-splitting node, a complement circuit branch and a true circuit branch connected to said phase-splitting node, said complement circuit branch including a first isolation FET, a first charging FET and a first bootstrapped driver FET, said first isolation FET having its source connected to said phase-splitting node and its drain connected to the source of said first charging FET and to the gate of said bootstrapped FET, said first charging FET having its drain connected to a drain potential, and its gate connected to a memory select pulse, said first bootstrapped driver FET having its drain connected to a clock pulse which is non-overlapping with said memory select pulse and its source connected to a complementary output node, for generating the complement form of the signal at the input node when said clock pulse is present, said true circuit branch including an inverting FET, a second isolation FET, a second charging FET and a second bootstrapped driver FET, said inverting FET having its source connected to ground and its gate connected to said phase-splitting node, said second isolation FET having its source connected to the drain of said inverting FET and its drain connected to the source of said second charging FET and to the gate of said second bootstrapped FET, said second charging FET having its drain connected to said drain potential and its gate connected to said memory select pulse, said second bootstrapped driver FET having its drain connected to said clock pulse and its source connected to an output node, for generating the true form of the signal at the input node when said clock pulse is present, the improvement in which comprises:

said second isolation FET having a gate size substantially smaller than the gate size for said inverting FET;

said first isolation FET having its gate connected to said drain potential for isolating said gate of said first bootstrapped FET from said phase-splitting node when the potential of the gate of said first bootstrapped FET approaches its maximum value as it is charged by said charging FET;

said second isolation FET having its gate connected to said phase-splitting node for more rapidly switching from its on-state to its off-state than does said inverting FET;

whereby the number of clock pulse sources necessary to operate the generator circuit is reduced and the speed of the generator circuit is increased.

2. In the low power ratioless, true/complement generator circuit of claim 1, which further comprises:

a first driving FET having its drain connected to said drain potential, its gate connected to said complementary output node of said first bootstrapped FET, and its source connected to a complementary circuit output node;

a second driving FET having its drain connected to said drain potential, its gate connected to said output node of said second bootstrapped driver, and its source connected to a circuit output node;

whereby the full driving capacity of said drain potential, less the threshold voltage of said driving transistors, is applied to said circuit complementary output node and circuit output node, to achieve a high capacitance driving capability.

3. In the low power ratioless, true/complement generator circuit of claim 2, which further comprises:

a first latching transistor having its drain connected to said circuit complementary output node, its gate connected to said circuit output node and its source connected to ground potential;

a second latching transistor having its drain connected to said circuit output node, its gate connected to said complementary circuit output node, and its source connected to ground potential;

a first reset transistor having its drain connected to said circuit complementary output node, its gate connected to said memory select pulse, and its source connected to ground potential;

a second reset transistor having its drain connected to said circuit output node, its gate connected to said memory select pulse and its source connected to said ground potential;

said first latching transistor entering into conduction when said circuit output node has an on-signal, for latching said circuit complementary output node to said ground potential, thereby holding said second latching transistor off;

said second latching transistor entering into conduction when said circuit complementary output node has a positive state signal, for latching said circuit output node to ground potential, thereby maintaining said first latching transistor off;

said first and second reset transistors connecting said circuit complementary output node, and said circuit output node, respectively, to ground potential, thereby terminating the duration of said latched signals from said first and second driving FETs, when said memory select pulse is in its on state; and whereby the signal from the sources of the first and second driving FETs is made available to said circuit complementary output node and circuit output node, respectively, immediately following said clock pulse and then latched by means of said latching transistors.

* * * * *